United States Patent
Xie et al.

(10) Patent No.: US 11,469,777 B2
(45) Date of Patent: Oct. 11, 2022

(54) METHOD FOR OPTIMIZING PROTOGRAPH-BASED LDPC CODE OVER UNDERWATER ACOUSTIC CHANNEL

(71) Applicant: Zhejiang University, Hangzhou (CN)

(72) Inventors: Lei Xie, Hangzhou (CN); Huifang Chen, Hangzhou (CN); Hongda Duan, Hangzhou (CN)

(73) Assignee: Zhejiang University, Hangzhou (CN)

( * ) Notice: Subject to any disclaimer, the term of this patent is extended or adjusted under 35 U.S.C. 154(b) by 0 days.

(21) Appl. No.: 17/336,717

(22) Filed: Jun. 2, 2021

(65) Prior Publication Data
US 2021/0376858 A1   Dec. 2, 2021

(30) Foreign Application Priority Data
Jun. 2, 2020   (CN) .......................... 202010490139.4

(51) Int. Cl.
*H03M 13/11* (2006.01)
*H03M 13/00* (2006.01)
*H04B 11/00* (2006.01)
*H04B 13/02* (2006.01)

(52) U.S. Cl.
CPC .... *H03M 13/1182* (2013.01); *H03M 13/1174* (2013.01); *H03M 13/616* (2013.01); *H04B 11/00* (2013.01); *H04B 13/02* (2013.01); *H03M 13/1131* (2013.01)

(58) Field of Classification Search
CPC ................................................. H03M 13/1182
See application file for complete search history.

(56) References Cited

U.S. PATENT DOCUMENTS

| 8,386,869 B1* | 2/2013 | Kou ................. H03M 13/6343 714/746 |
| 2009/0150746 A1* | 6/2009 | Chaichanavong ......................... H03M 13/6561 714/752 |
| 2014/0164876 A1* | 6/2014 | Gasanov ................ H03M 5/12 714/769 |

* cited by examiner

*Primary Examiner* — Joseph D Torres
(74) *Attorney, Agent, or Firm* — Polsinelli PC

(57) ABSTRACT

The present disclosure provides a method for optimizing a protograph-based LDPC code over an underwater acoustic (UAW) channel. The traditional protograph-based LDPC code over an UAW channel does not consider performance in an error floor region. The method first determines parameters such as a protograph-based LDPC code length, a basic protograph, a target decoding threshold, a threshold adjustment factor, and an ACE check parameter. The protograph is optimized, and the method constructs a parity check matrix by using a UAW channel-based PEG/ACE hybrid algorithm, performs ACE check on the parity check matrix, and calculates a decoding threshold for the matrix passing the check. If the decoding threshold is within a range of an iterative decoding threshold, the parity check matrix is a final optimized matrix. Otherwise, the method continues to optimize the protograph until a parity check matrix passing the check is obtained.

3 Claims, 2 Drawing Sheets

METHOD FOR OPTIMIZING PROTOGRAPH-BASED LDPC CODE OVER UNDERWATER ACOUSTIC CHANNEL

CROSS REFERENCE TO RELATED APPLICATION

This patent application claims the benefit and priority of Chinese Patent Application No. 202010490139.4, filed on Jun. 2, 2020, the disclosure of which is incorporated by reference herein in its entirety as part of the present application.

TECHNICAL FIELD

The present disclosure belongs to the field of communication technologies, and relates to a method for optimizing a protograph-based low-density parity-check (LDPC) code over an underwater acoustic (UAW) channel, which specifically optimizes the protograph-based LDPC code over a UAW channel to improve channel coding performance.

BACKGROUND ART

Marine resources have become one of the most important national strategic resources. The underwater communication technology is one of the key technologies for the exploration and development of marine resources. However, radio transmission fades severely underwater, and optical communication suffers from severe scattering. Therefore, sound waves are usually used as carriers of underwater information transmission, and the UAW technology is used for underwater long-distance communication. However, the fast time-varying effect, severe multipath effect, limited bandwidth, and severe signal fading of UAW channels bring huge difficulty to the design of a UAW communication system.

The channel coding technology is the key to ensuring the reliability of UAW communication. In early UAW communication, traditional channel coding methods such as BCH codes, RS codes, and convolutional codes are often used. However, none of these codes can reach channel capacity. Until 2011, Zhu Min et al. from the Institute of Acoustics of the Chinese Academy of Sciences used Turbo codes in channel coding for the UAW communication modem of the Jiaolong manned submersible, successfully realizing reliable underwater video transmission. In 2013, Wu Yanbo et al. from the Institute of Acoustics of the Chinese Academy of Sciences used non-binary LDPC codes in a UAW communication modem, realizing reliable underwater communication.

The existing LDPC codes over a UAW channel are mostly optimized on the basis of good codes in wireless channels. However, the optimization considers only the performance in low signal-to-noise ratio region, to lower a decoding threshold of the LDPC codes, and does not consider an error floor that may occur under a high signal-to-noise ratio. With the growing requirements for UAW communication, the performance in error floor area should also be considered.

A protograph-based LDPC code is a channel coding method with low storage capacity and simple coding, and can be applied to various scenarios due to its flexible code length. For UAW communication scenarios, the performance of channel coding can be improved and the reliability of communication can be enhanced if the design of the protograph-based LDPC code can be optimized.

SUMMARY

In order to optimize a protograph-based LDPC code for UAW communication scenarios, the present disclosure proposes a method for optimizing a protograph-based LDPC code over a UAW channel, so as to improve the reliability of UAW communication.

The method according to the present disclosure specifically includes the following steps.

Step (1). Construct a UAW channel transfer function based on an eigenray model: a channel is represented by a linear time-invariant finite impulse response filter, and z-transform for finite impulse response is: $H(z)=\sum_{l=1}^{L} A_l \times z^{-\tau_l}$, where L denotes the number of multipaths of the channel in a symbol duration, $A_l$ is a signal amplitude of the l-th multipath, $\tau_l$ is a relative signal delay of the l-th multipath, and l=1, 2, . . . , L; and determine, based on a basic protograph B and an LDPC code length N, first-extension times $T_1$ and second-extension times $T_2$ of the protograph, where the basic protograph B is an m×n matrix, and $$B = \begin{bmatrix} B_{1,1} & B_{1,2} & \cdots & B_{1,n} \\ B_{2,1} & B_{2,2} & \cdots & B_{2,n} \\ \vdots & \vdots & \ddots & \vdots \\ B_{m,1} & B_{m,2} & \cdots & B_{m,n} \end{bmatrix};$$

each row of matrix B corresponds to one check node, and there are a total of m check nodes; each column of matrix B corresponds to one variable node, and there are a total of n variable nodes; element $B_{i,j}$ represents a quantity of edges between the i-th check node and the j-th variable node, i=1, 2, . . . , m, and j=1, 2, . . . , n;

a value of $T_1$ is set to be greater than or equal to a maximum value of elements in the matrix of the basic protograph B, $$\frac{N}{T_1 \times n}$$

is set to a minimum value among integers; and $$T_2 = \frac{N}{T_1 \times n}.$$

The eigenray model takes the propagation of sound waves as the propagation of countless rays perpendicular to an isophase plane, where each ray is perpendicular to the isophase plane, and the ray is an eigenray; it is assumed that a sound velocity and an refractive index do not change horizontally, but are only a function of depth; sea surface and seabed interfaces are assumed to be flat interfaces; positions of a sound source and a reception point are static and unchanged; a sound field is determined by the eigenray; and an entire UAW channel is taken as a network system;

Step (2). Select two variable nodes for the first optimization:

rearranging n variable nodes in the basic protograph B in descending order of column weights, to obtain a rearranged protograph $\overline{B}$, where the column weight is the sum of values of m elements constituting a variable node;

one of the variable nodes to be optimized is a variable node with a largest column weight in $\overline{B}$, and a sequence number of the variable node is $j_a=1$; the other variable node to be optimized is a variable node with the smallest column weight among variable nodes with a column weight greater than 2, and a sequence number of the variable node is $j_b$; and $j_b > j_a$.

Step (3). Among m elements of the variable node numbered $j_b$, subtracting 1 from a value of element $B_{i,j_b}$ with a maximum value, to reduce the column weight of the variable node numbered $j_b$, where $i \in (1,m)$; among m elements of the variable node numbered $j_a$, adding 1 to a value of element $B_{i,j_a}$, to keep a row weight of the i-th check node $c_i$ unchanged and increase the column weight of the variable node numbered $j_a$, where the row weight is the sum of values of n elements constituting a check node; and a matrix with the values of the element $B_{i,j_b}$ and the element $B_{i,j_a}$ changed is an optimized protograph $\tilde{B}$.

Step (4): If $j_a + 1 \geq j_b - 1$, rearrange n variable nodes in the optimized protograph $\tilde{B}$ in descending order of column weights, repeat steps (2) and (3) until $j_a + 1 < j_b - 1$, and then perform step (5).

Step (5). Replicate check nodes and variable nodes in the optimized protograph $\tilde{B}$ in step (4) for $T_1$ times, and generate a transition graph B' by using a traditional progressive edge growth (PEG) algorithm, where the transition graph B' is an in m'×n'matrix, $m' = T_1 \times m$, and $n' = T_1 \times n$.

Step (6). Replicate check nodes and variable nodes in the transition graph B' for $T_2$ times, to obtain a derived graph matrix $\overline{H}$; and interleave all edges of $\overline{H}$ by using a UAW channel-based traditional PEG/approximate cycle extrinsic message degree (ACE) hybrid construction algorithm, to generate a parity check matrix H', where the UAW channel-based PEG/ACE hybrid construction algorithm is as follows:

(6-1). calculating a column weight $w_{j'}$ of each variable node $v_{j'}$ in $\overline{H}$, where j' 1, 2, . . . , N, and rearranging the variable nodes in ascending order of column weights to obtain a rearranged derived graph $\tilde{H}$, where $\tilde{H}$ is an M×N matrix, and $$M = \frac{m \times N}{n};$$

(6-2). adding L virtual check nodes $(c_1', c_2', \ldots, c_L')$ to $\tilde{H}$, and adding two virtual edges $(v_{j'}, c'_l)$ and $(v_{j'-\tau_l}, c'_l)$ related to the variable node $v_{j'}$ for any virtual check node $c'_l$, that is, adding 2 L virtual edges in total, where L denotes the number of multipaths of the channel in a symbol duration, and l=1, 2, . . . , L;

(6-3). for $v_{j'}$, generating $w_{j'}$ generated edges $e_k$, where k=1, 2, . . . , $w_{j'}$, and the generating process is as follows:

taking $v_{j'}$ as a root node, extending a path tree $R_{j'}$ based on the 2 L virtual edges, where the path tree $R_{j'}$ extends to layer d at most, d is a maximum number of layers that the path tree extends, and a set of candidate check nodes C= $\overline{N}_{j'}^{(d)}$; $N_{j'}^{(d)}$ represents a set of check nodes in the path tree $R_{j'}$, $\overline{N}_{j'}^{(d)}$ is a complement of $N_{j'}^{(d)}$, $\overline{N}_{j'}^{(d)} = V_c \backslash N_{j'}^{(d)}$, and $V_c$ is a set of check nodes in $\tilde{H}$ that are allowed to be connected to $V_{j'}$;

calculating an ACE value of a ring generated by edges $(v_{j'}, c_p)$ connecting candidate check nodes $c_p$ in C and $v_{j'}$, where the ACE value of the ring is the sum of ACE values of all variable nodes on the ring, and an ACE value of a variable node is a column weight of the variable node minus 2; and reserving an edge $(v_{j'}, c_{max\_p})$ connecting a candidate check node $c_{max\_p}$ with the largest ACE value of the ring and $v_{j'}$ as the generated edge $e_k$, and deleting other connected edges;

(6-4). deleting all virtual check nodes and virtual edges; and (6-5). repeating (6-2) to (6-4) until the generated edges of all variable nodes in $\tilde{H}$ are generated, to obtain the parity check matrix H'.

Step (7). Perform ACE check on rings in which all variable nodes $v_{j'}$ in the parity check matrix H' are located:

if the ACE check on H' fails, using variable nodes numbered $j'_a$ and $j'_b$ in B' as two variable nodes for the next optimization, and performing step (3), where $j'_a = j_a + 1$, and $j'_b = j_b - 1$;

if the ACE check on H' is successful, performing step (8);

an ACE check method for a ring in which any variable node $v_{j'}$ is located is as follows:

(7-1). performing initialization: making all check nodes and all variable nodes except $v_{j'}$ in the parity check matrix H' satisfy $\rho(\mu_t) = \infty$, where $\mu_t$ represents all check nodes and all variable nodes except $v_{j'}$ in the parity check matrix H', $\rho(\mu_t)$ is an ACE value of a path $(v_{j'}, \mu_t)$, an ACE value of a path is equal to the sum of ACE values of all variable nodes in the path, and $\rho(v_{j'})$ is equal to an ACE value $ACE(v_{j'})$ of the variable node $v_{j'}$;

(7-2). taking $v_{j'}$ as a root node, extending a path tree $R'_{j'}$, where the path tree $R'_{j'}$ extends to layer $d_{ACE}$ at most;

(7-3). finding a child node set $Ch(w_s)$ for any node $w_s$ with a depth of d' in the path tree $R'_{j'}$, where $0 \leq d' \leq d_{ACE}$; each node in $Ch(w_s)$ satisfies $w_{s'} \in Ch(w_s)$; and if $\rho(w_s) + \rho(w_{s'}) - ACE(v_{j'}) < \varepsilon$, the check fails, or if $\rho(w_s) + \rho(w_{s'}) - ACE(v_{j'}) \geq \varepsilon$, step (7-4) is performed, where $\varepsilon$ represents an ACE check parameter;

(7-4). if $\rho(w_s) + ACE(w_{s'}) \geq \rho(w_{s'})$, deleting a path $(w_s, w_{s'})$ from the path tree $R'_{j'}$;

if $\rho(w_s) + ACE(w_{s'}) < \rho(w_{s'})$, setting $\rho(w_{s'}) = \rho(w_s) + ACE(w_{s'})$, where $ACE(w_{s'})$ is an ACE value of the node $w_{s'}$; and (7-5). repeating steps (7-3) and (7-4) until there is no check failure for nodes at all depths in the path tree $R'_{j'}$, indicating that the check is successful.

Step (8). Calculate a decoding threshold $\gamma'$ for an optimized codeword by using an extrinsic information transfer chart algorithm of a finite-length protograph-based LDPC code over an UAW channel: if $|\gamma - \gamma'| \geq \eta$, using the variable nodes numbered $j'_a$ and $j'_b$ in B' as two variable nodes for the next optimization, and performing step (3), where $\gamma$ is a target decoding threshold, $\eta$ is a threshold adjustment factor, $j'_a = j_a + 1$, and $j'_b = j_b - 1$; if $|\gamma - \gamma'| < \eta$, performing step (9).

Step (9). Obtain a final optimized parity check matrix H=H'.

The common optimization methods only focus on optimization of the decoding threshold, and cannot ensure the performance in the high signal-to-noise ratio regions. Compared with these optimization methods, the method of the present disclosure considers both the performance of low signal-to-noise ratio regions and high signal-to-noise ratio regions, and ensures that no error floor occurs in the high signal-to-noise ratio regions.

DETAILED DESCRIPTION OF THE EMBODIMENTS

The specific embodiments of the present disclosure and achieved performance are described below in conjunction with the accompanying drawings.

Figure 1:
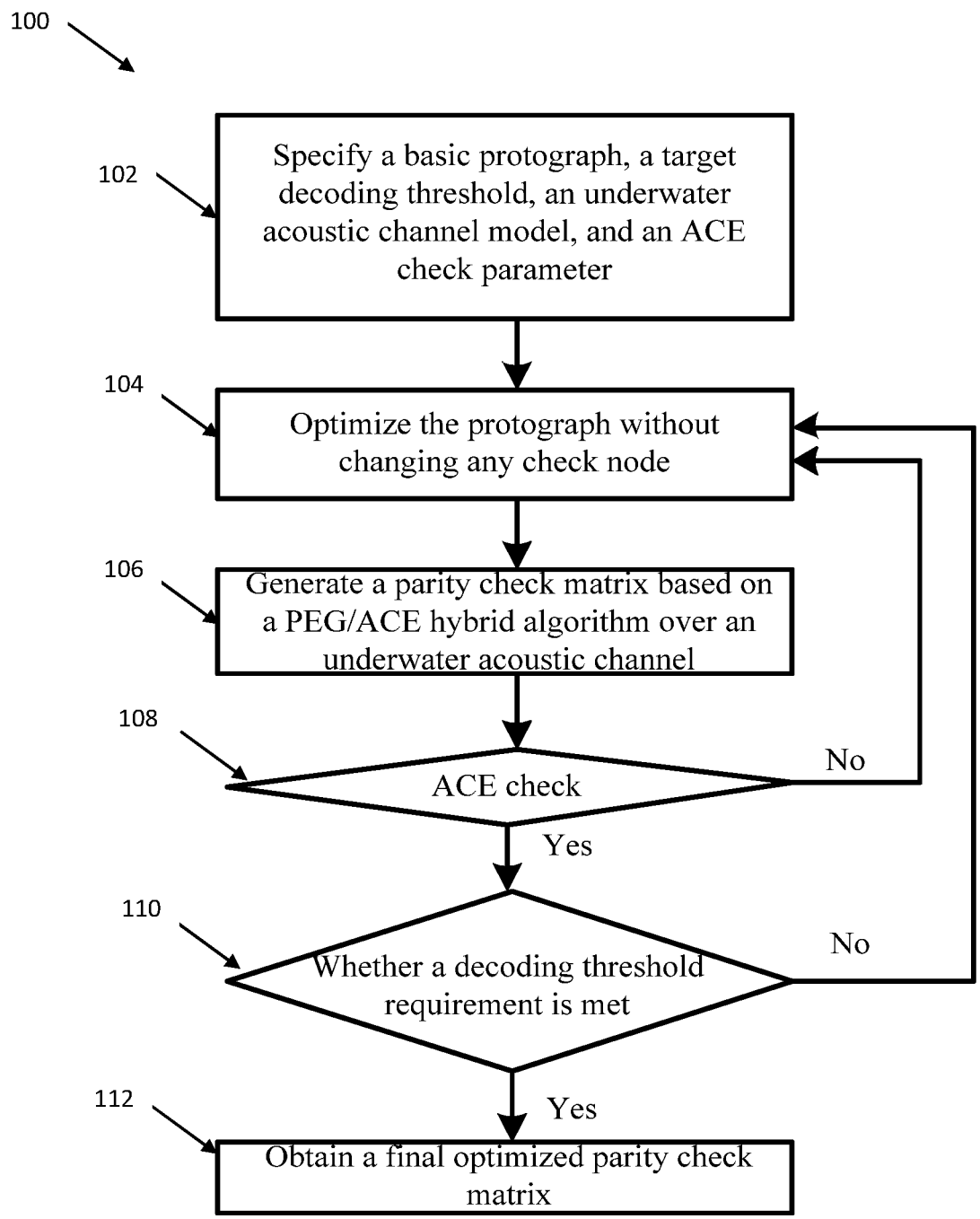
FIG. 1 is a flowchart for a method according to the present disclosure.

As shown in FIG. 1, taking a protograph-based LDPC code with a code length of N=1024 as an example, a method 100 for optimizing a protograph-based LDPC code over a UAW channel includes the following steps.

(1). At block 102, assuming that a UAW channel transfer function is $H(z)=1+0.263112z^{-7}+0.151214z^{-39}+0.391599z^{-67}$, L=4, a basic protograph is an m×n matrix, m=4 and n=8, that is, $$B = \begin{bmatrix} 0 & 2 & 3 & 0 & 0 & 1 & 0 & 1 \\ 2 & 1 & 2 & 1 & 0 & 0 & 0 & 1 \\ 1 & 2 & 1 & 1 & 1 & 0 & 1 & 0 \\ 1 & 1 & 1 & 2 & 1 & 0 & 1 & 0 \end{bmatrix},$$

set $T_1$ to be greater than or equal to a maximum value 3 of elements in the matrix of the basic protograph B, where $$\frac{128}{T_1}$$

is a minimum value among integers, that is, $T_1=4$, and $$T_2 = \frac{N}{T_1 \times n} = 32.$$

(2). At block 104, rearrange eight variable nodes in the basic protograph B in descending order of column weights, to obtain a rearranged protograph $$\overline{B} = \begin{bmatrix} 3 & 2 & 0 & 0 & 0 & 1 & 0 & 1 \\ 2 & 1 & 2 & 1 & 0 & 1 & 0 & 0 \\ 1 & 2 & 1 & 1 & 1 & 0 & 1 & 0 \\ 1 & 1 & 1 & 2 & 1 & 0 & 1 & 0 \end{bmatrix},$$

where one of variable nodes to be optimized is a variable node with a largest column weight in $\overline{B}$, and a sequence number of the variable node is $j_a=1$; the other variable node to be optimized is a variable node with a smallest column weight among variable nodes with a column weight greater than 2, and a sequence number of the variable node is $j_b=4$.

(3). Among four elements of the variable node numbered $j_b=4$, subtract 1 from a value of element $\overline{B}_{4,4}$ with a maximum value; and among four elements of the variable node numbered $j_a=1$, add 1 to a value of element $\overline{B}_{4,1}$, to obtain an optimized protograph $\tilde{B}$:

$$\tilde{B} = \begin{bmatrix} 3 & 2 & 0 & 0 & 0 & 1 & 0 & 1 \\ 2 & 1 & 2 & 1 & 0 & 1 & 0 & 0 \\ 1 & 2 & 1 & 1 & 1 & 0 & 1 & 0 \\ 1 & 1 & 1 & 2 & 1 & 0 & 1 & 0 \end{bmatrix}.$$

(4). If $j_a+1<j_b-1$, perform step (5).

(5). Replicate check nodes and variable nodes in the optimized protograph $\tilde{B}$ for four times, and generate a transition graph B' by using a traditional PEG algorithm, where the transition graph B' is an m'×n' matrix, m'=16, and n'=32.

(6). At block 106, replicate check nodes and variable nodes in the transition graph B' for $T_2$ times, to obtain a derived graph matrix $\overline{\overline{H}}$; rearrange all variable nodes in $\overline{\overline{H}}$ in ascending order of column weights to obtain a rearranged derived graph $\tilde{H}$, where $\tilde{H}$ is an M×N matrix, M=512, and N=1024; and obtain a parity check matrix H' by using a UAW channel-based traditional PEG/approximate cycle extrinsic message degree (ACE) hybrid construction algorithm.

(7). At block 108, perform ACE check on rings in which all variable nodes $v_{j'}$ in the parity check matrix H' are located, where a maximum number of layers that a path tree extends is $d_{ACE}=3$, an ACE check parameter is $\varepsilon=3$, and the rings in which all the variable nodes $v_{j'}$ in the parity check matrix H' are located pass the ACE check.

(8). At block 110, calculate a decoding threshold for an optimized codeword by using an extrinsic information transfer chart algorithm of a finite-length protograph-based LDPC code over a UAW channel, where a target decoding threshold is $\gamma=3$ dB a threshold adjustment factor is $\eta=0.5$ dB, a calculated threshold is 3.2 dB, and |3 dB-3.2 dB|<0.5 dB, within an allowable range of an iterative decoding threshold.

Figure 2:
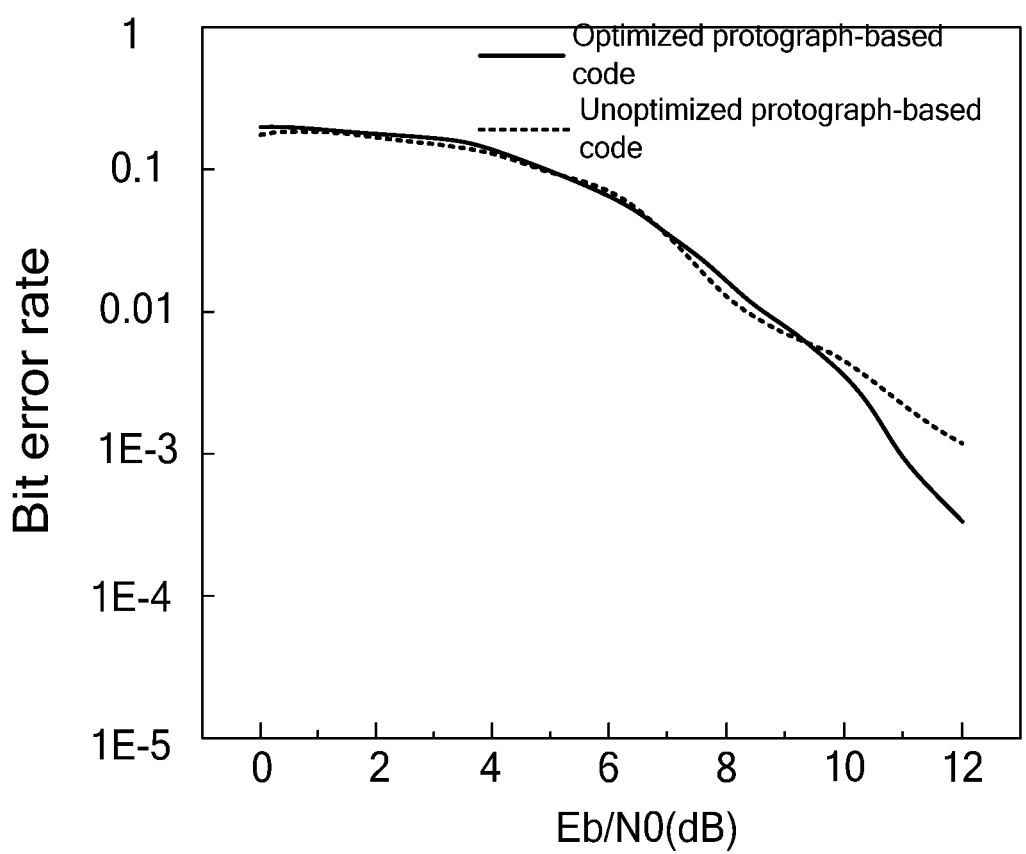
FIG. 2 is a comparison diagram showing bit error rates for protograph-based LDPC codes with codewords optimized and unoptimized according to an embodiment.

(9). At block 112, obtain an optimized parity check matrix H=H'. FIG. 2 shows a bit error rate of a codeword constructed using H and a bit error rate of a codeword directly constructed using the unoptimized protograph. It can be seen from the results in FIG. 2 that a coding result obtained by this method in an error floor region is better than that obtained by using the unoptimized protograph-based code.

The content described in the foregoing embodiment is only an example of the implementations of the present disclosure. The protection scope of the present disclosure shall not be limited to the specific forms stated in the embodiments. The protection scope of the present disclosure shall also include similar methods conceived on the basis of the present disclosure.

What is claimed is:

1. (Current amended) A method for optimizing a protograph-based low-density parity-check (LDPC) code over an underwater acoustic (UWA) channel, comprising:

step (1): constructing an UWA channel transfer function based on an eigenray model: a channel is represented by a linear time-invariant finite impulse response filter, and z-transform for finite impulse response is: $H(z)=\sum_{l=1}^{L} A_l \times z^{-\tau_l}$, wherein L denotes the number of multipaths of the channel in a symbol duration, $A_l$ is a signal amplitude of the l-th multipath, $\tau_l$ is a relative signal delay of the l-th multipath, and l=1, 2, ..., L; and determining, based on a basic protograph B and an LDPC code length N, first-extension times $T_1$ and second-extension times $T_2$ of the protograph, wherein the basic protograph B is an m×n matrix, and $$B = \begin{bmatrix} B_{1,1} & B_{1,2} & \cdots & B_{1,n} \\ B_{2,1} & B_{2,2} & \cdots & B_{2,n} \\ \vdots & \vdots & \ddots & \vdots \\ B_{m,1} & B_{m,2} & \cdots & B_{m,n} \end{bmatrix};$$

each row of the matrix corresponds to one check node, and there are a total of m check nodes; each column of matrix B corresponds to one variable node, and there are a total of n variable nodes; element $B_{i,j}$ represents a quantity of edges between the i-th check node and the j-th variable node, i=1,2, ..., m and j=1,2, ..., n;

a value of $T_1$ is set to be greater than or equal to a maximum value of elements in the matrix of the basic protograph $$\frac{N}{T_1 \times n}$$

is set to a minimum value among integers; and $$T_2 = \frac{N}{T_1 \times n};$$

wherein the eigenray model takes propagation of sound waves as propagation of countless rays perpendicular to an isophase plane, wherein each ray is perpendicular to the isophase plane, and the ray is an eigenray; it is assumed that a sound velocity and an refractive index do not change horizontally, but are only a function of sea depth; sea surface and seabed interfaces are assumed to be flat interfaces; positions of a sound source and a reception point are static and unchanged; a sound field is determined by the eigenray; and an entire UWA channel is taken as a network system;

step (2): selecting two variable nodes for the first optimization:

rearranging n variable nodes in the basic protograph B in descending order of column weights, to obtain a rearranged protograph $\overline{B}$, wherein the column weight is the sum of values of m elements constituting a variable node;

one of the variable nodes to be optimized is a variable node with a largest column weight in $\overline{B}$, and a sequence number of the variable node is $j_a=1$; the other variable node to be optimized is a variable node with the smallest column weight among variable nodes with a column weight greater than 2, and a sequence number of the variable node is $j_b$; and $j_b > j_a$;

step (3): among m elements of the variable node numbered $j_b$, subtracting 1 from a value of element $B_{i,j_b}$ with a maximum value, to reduce the column weight of the variable node numbered $j_b$, wherein i∈(1, m); among m elements of the variable node numbered $j_a$, adding 1 to a value of element $B_{i,j_a}$, to keep a row weight of the i-th check node $c_i$ unchanged and increase the column weight of the variable node numbered $j_a$, wherein the row weight is the sum of values of n elements constituting a check node; and a matrix with the values of the element $B_{i,j_b}$ and the element $B_{i,j_a}$ changed is an optimized protograph $\tilde{B}$;

step (4): if $j_a+1 \geq j_b-1$, rearranging n variable nodes in the optimized protograph $\tilde{B}$ in descending order of column weights, repeating steps (2) and (3) until $j_a+1 < j_b-1$, and then performing step (5);

step (5): replicating check nodes and variable nodes in the optimized protograph $\tilde{B}$ in step (4) for $T_1$ times, and generating a transition graph B' by using a traditional progressive edge growth (PEG) algorithm, wherein the transition graph B' is an m'×n' matrix, m'=$T_1$×m, and n'=$T_1$×n, step (6): replicating check nodes and variable nodes in the transition graph B' for $T_2$ times, to obtain a derived graph matrix $\overline{H}$; and interleaving all edges of $\overline{H}$ by using a UWA channel-based traditional PEG/approximate cycle extrinsic message degree (ACE) hybrid construction algorithm, to generate a parity check matrix H';

step (7): performing ACE check on rings in which all variable nodes $v_j$ in the parity check matrix H' are located:

if H' does not pass the ACE check, using variable nodes numbered $j'_a$ and $j'_b$ in B' as two variable nodes for the next optimization, and performing step (3), wherein $j'_a = j_a+1$, and $j'_b = j_b-1$;

if H' passes ACE check, performing step (8);

step (8): calculating a decoding threshold $\gamma'$ for an optimized codeword by using an extrinsic information transfer chart algorithm of a finite-length protograph-based LDPC code over the UWA channel: if $|\gamma - \gamma'| \geq \eta$, using the variable nodes numbered $j'_a$ and $j'_b$ in B' as two variable nodes for the next optimization, and performing step (3), wherein $\gamma$ is a target decoding threshold, $\eta$ is a threshold adjustment factor, $j'_a = j_a+1$, and $j'_b = j_b-1$; if $|\gamma - \gamma'| < \eta$, performing step (9);

step (9): obtaining a final optimized parity check matrix H=H'; and step (10): transmitting a transmission signal comprising an optimized encoded data using the final optimized parity check matrix H.

2. The method for optimizing the protograph-based LDPC code over the UWA channel according to claim 1, wherein the UWA channel-based PEG/ACE hybrid algorithm in step (6) is as follows:

(6-1): calculating a column weight $w_{j'}$ of each variable node $v_{j'}$ in $\overline{H}$, wherein j'=1, 2, . . . , N, and rearranging the variable nodes in ascending order of column weights to obtain a rearranged derived graph $\overline{H}$, wherein $\overline{H}$ is an M×N matrix, and $$M = \frac{m \times N}{n};$$

(6-2): adding L virtual check nodes ($c'_1$, $c'_2$, . . . , $c'_L$) to $\overline{H}$, and adding two virtual edges ($v_{j'}$, $c'_l$) and ($v_{j'-\tau_l}$, $c'_l$) related to the variable node $v_{j'}$ for any virtual check node $c'_l$, that is, adding 2L virtual edges in total, wherein L denotes the number of multipaths of the channel in a symbol duration, and l=1, 2, . . . , L.

(6-3): for $v_{j'}$, generating $w_{j'}$ generated edges $e_k$, wherein k=1, 2, . . . , $w_{j'}$ and the generating process is as follows:

taking $v_{j'}$ as a root node, extending a path tree $R_{j'}$ based on the 2L virtual edges, wherein the path tree $R_{j'}$ extends to layer d at most, d is a maximum number of layers that the path tree extends, and a set of candidate check nodes is C=$\overline{N}_{j'}^{(d)}$; $N_{j'}^{(d)}$ represents a set of check nodes in the path tree $R_{j'}$, $\overline{N}_{j'}^{(d)}$ is a complement of $N_{j'}^{(d)}$, $\overline{N}_{j'}^{(d)} = V_c \backslash N_{j'}^{(d)}$, and $V_c$ is a set of check nodes in $\overline{H}$ that are allowed to be connected to $v_{j'}$;

calculating an ACE value of a ring generated by edges ($v_{j'}$, $c_p$) connecting candidate check nodes $c_p$ in C and $v_{j'}$, wherein the ACE value of the ring is the sum of ACE values of all variable nodes on the ring, and an ACE value of a variable node is a column weight of the variable node minus 2; and reserving an edge ($v_{j'}$, $c_{maxp}$) connecting a candidate check node $c_{maxp}$ with the largest ACE value of the ring and $v_{j'}$ as the generated edge $e_k$, and deleting other connected edges;

(6-4): deleting all virtual check nodes and virtual edges; and (6-5): repeating (6-2) to (6-4) until the generated edges of all variable nodes in $\bar{H}$ are generated, to obtain the parity check matrix H'.

3. The method for optimizing the protograph-based LDPC code over the UWA channel according to claim 1, wherein the ACE check method for the ring in which any variable node $v_j$ is located in step (7) is as follows:

(7-1): performing initialization: making all check nodes and all variable nodes except $v_j$ in the parity check matrix H' satisfy $\rho(\mu_t)=\infty$, wherein $\mu_t$ represents all check nodes and all variable nodes except $v_j$ in the parity check matrix H', $\rho(\mu_t)$ is an ACE value of a path $(v_j, \mu_t)$, an ACE value of a path is equal to the sum of ACE values of all variable nodes in the path, and $\rho(v_j)$ is equal to an ACE value $ACE(v_j)$ the variable node $v_j$;

(7-2): taking $v_j$ as a root node, extending a path tree $R'_j$, wherein the path tree $R'_j$ extends to layer $d_{ACE}$ at most;

(7-3): finding a child node set $Ch(w_s)$ for any node $w_s$ with a depth of d' in the path tree $R'_j$, wherein $0 \leq d' \leq d_{ACE}$; each node in $Ch(w_s)$ satisfies $w_{s'} \in Ch(w_s)$; and if $\rho(w_s)+\rho(w_{s'})-ACE(v_j)<\varepsilon$, the check fails, or if $\rho(w_s)+\rho(w_{s'})-ACE(v_j) \geq \varepsilon$, step (7-4) is performed, wherein $\varepsilon$ represents an ACE check parameter;

(7-4) if $\rho(w_s)+ACE(w_{s'}) \geq \rho(w_{s'})$ deleting a path $(w_s, w_{s'})$ from the path tree $R'_j$; if $\rho(w_s)+ACE(w_s)+ACE(w_{s'})<\rho(w_{s'})$ setting $\rho(w_{s'})=\rho(w_s)+ACE(w_{s'})$, wherein $ACE(w_{s'})$ is an ACE value of the node $w_{s'}$; and (7-5): repeating steps (7-3) and (7-4) until there is no check failure for nodes at all depths in the path tree $R'_j$, indicating that the check is successful.

* * * * *